United States Patent
Kim

(10) Patent No.: US 7,288,473 B2
(45) Date of Patent: Oct. 30, 2007

(54) METAL LAYER IN SEMICONDUCTOR DEVICE AND METHOD OF FORMING THE SAME

(75) Inventor: Hyoung-Yoon Kim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/294,455

(22) Filed: Dec. 6, 2005

(65) Prior Publication Data
US 2006/0131749 A1    Jun. 22, 2006

(30) Foreign Application Priority Data
Dec. 6, 2004    (KR) ............... 10-2004-0101606

(51) Int. Cl.
*H01L 21/4763* (2006.01)
(52) U.S. Cl. ............ 438/622; 438/627; 438/630; 438/682; 257/751; 257/758; 257/763
(58) Field of Classification Search ........ 438/622, 438/627, 630, 682; 257/751, 758, 763
See application file for complete search history.

(56) References Cited

U.S. PATENT DOCUMENTS

| | | | |
|---|---|---|---|
| 4,752,812 A * | 6/1988 | Arienzo et al. | 257/38 |
| 5,736,421 A * | 4/1998 | Shimomura et al. | 438/253 |
| 6,297,137 B1 * | 10/2001 | Jung | 438/592 |
| 6,545,317 B2 * | 4/2003 | Hokazono et al. | 257/336 |
| 6,607,989 B2 * | 8/2003 | Kodama | 438/720 |
| 6,727,156 B2 * | 4/2004 | Jung et al. | 438/396 |
| 2003/0122985 A1 * | 7/2003 | Park et al. | 349/43 |
| 2005/0124128 A1 * | 6/2005 | Kim | 438/305 |

* cited by examiner

*Primary Examiner*—Jerome Jackson
*Assistant Examiner*—Anthony Ho
(74) *Attorney, Agent, or Firm*—Finnegan, Henderson, Farabow, Garrett & Dunner, L.L.P.

(57) ABSTRACT

Canting or falling of an upper metal line may be prevented by improving adhesion between an insulation layer and a metal layer. A method for forming a semiconductor which improves adhesion between an insulation layer and a metal layer includes: preparing a substrate formed with a lower metal layer; forming an insulation layer on the substrate; forming a plug after etching the insulation layer; performing a silicon ion implantation process from above the insulation layer; forming an upper metal layer on the insulation layer, the upper metal layer having a bottom layer of a Ti layer or a TiN layer; and siliciding a predetermined region of the bottom layer of the upper metal layer by heat treatment of the substrate.

11 Claims, 3 Drawing Sheets

METAL LAYER IN SEMICONDUCTOR DEVICE AND METHOD OF FORMING THE SAME

CROSS-REFERENCE TO RELATED APPLICATION

This application claims priority to and the benefit of Korean Patent Application No. 10-2004-0101606 filed in the Korean Intellectual Property Office on Dec. 6, 2004, the entire contents of which are incorporated herein by reference.

BACKGROUND (a) Technical Field

The present invention relates to a metal layer in a semiconductor device and a method of forming the same. More particularly, the present invention relates to a method of forming a metal layer in a semiconductor device that may prevent canting and falling of a metal line by enhancing adhesion of the metal layer with an insulation layer.

(b) Description of the Related Art

Recently, semiconductor devices have become more highly integrated such that a line width thereof has been reduced to below 0.25 μm, and metal wiring is formed to be very narrow during a manufacturing process of a semiconductor device. As the design rule is decreased, a height of metal wiring is increased while a width thereof is decreased. Usually, a metal line is formed by a sequence of processes such as a metal deposition process, a photolithography process, an etching process, etc. When a metal layer used to form a high height and a narrow width does not have sufficient adhesion to a lower insulation layer, a metal line may cant or fall down on the lower insulation layer during a process such as a wet process, an annealing process, etc., that is performed after the etching of the metal layer.

FIG. 1 shows a conventional method of forming a metal layer. Referring to FIG. 1, a metal line includes a lower Ti layer 110, a lower TiN layer 120, a conductive layer 130, an upper Ti layer 140, and an upper TiN layer 150. A height of the metal line is high and a width thereof is narrow such that a contact area between a lower insulation layer 100 and the metal layer is small. In this case, when adhesion between the lower insulation layer 100 and the metal line is not sufficient, the metal line may cant or fall on the lower insulation layer 100. In particular, as shown in FIG. 1 at 160, the metal line may cant or fall on a region wherein only an insulation layer exists in the lower layer of the metal line, without a metal layer such as a plug.

Therefore, adhesion between the lower insulation layer 100 and the metal layer should be enhanced in order to prevent canting or falling of the metal line.

The above information disclosed in this Background section is only for enhancement of understanding of the background of the invention and therefore it may contain information that does not form the prior art that is already known in this country to a person of ordinary skill in the art.

SUMMARY

Consistent with the invention, there is provided a metal layer in a semiconductor device and a method of forming the same that may prevent canting or falling of a metal line by improving adhesion between an insulation layer and the metal layer by forming titanium silicide in an interface thereof.

An exemplary method of forming a metal layer in a semiconductor device according to an embodiment consistent with the present invention includes: preparing a substrate formed with a lower metal layer; forming an insulation layer on the substrate; forming a plug after etching the insulation layer; performing a silicon ion implantation process from above the insulation layer; forming an upper metal layer on the insulation layer, the upper metal layer having a bottom layer of a barrier metal layer; and siliciding a predetermined region of the bottom layer of the upper metal layer by heat treatment of the substrate.

A Si-rich insulation layer may be formed at an uppermost portion of the insulation layer by the silicon ion implantation process.

A silicon layer may be formed on the insulation layer by the silicon ion implantation process.

Deposit thickness of the Si-rich insulation layer may be 1000-3000 Å, and implantation depth of silicon ions by the silicon ion implantation process may be 50-300 Å.

During the siliciding of a predetermined region of the bottom layer, a titanium silicide may be formed because silicon at a top of the insulation layer and barrier metal in the bottom layer of the upper metal layer mutually diffuse.

The siliciding of a predetermined region of the bottom layer may be achieved by a rapid thermal process or a furnace annealing process.

The rapid thermal process may be performed at a temperature of 100-500° C. for at least 10 seconds.

The barrier metal layer may be formed as a Ti layer, a TiN layer, or a combination thereof.

The barrier metal layer may be formed by sequentially forming a Ti layer having a thickness of 30-100 Å and a TiN layer having a thickness of 100-300 Å.

During forming of the upper metal layer, a lower Ti layer, a lower TiN layer, a conductive layer, an upper Ti layer, and an upper TiN layer may be sequentially deposited.

An exemplary metal layer in a semiconductor device according to another embodiment consistent with the present invention includes a semiconductor substrate prepared with a lower metal layer, an insulation layer formed on the semiconductor substrate, an upper metal layer formed on the insulation layer and having a bottom layer including an adhesion layer and a barrier metal layer, and a plug connecting the lower metal layer and the upper metal layer.

The adhesion layer of the upper metal layer may be formed as a silicide layer of the barrier metal layer, and the barrier metal layer may be formed as a Ti layer, a TiN layer, or a combination thereof. The upper metal layer may include a Ti silicide layer having a thickness of 50-350 Å after the siliciding process and a TiN layer having a thickness of 100-300 Å. In addition, the upper metal layer may further include a Ti layer having a thickness of 5-50 Å formed between the Ti silicide layer and the TiN layer.

The uppermost portion of the insulation layer may be formed as a Si-rich insulation layer, and the adhesion layer of the upper metal layer is formed as a silicide layer of the barrier metal layer. The Si-rich insulation layer may have a thickness of 1000-3000 Å after the siliciding process. The upper metal layer may include a Ti silicide layer having a thickness of 50-350 Å after the siliciding process and a TiN layer having a thickness of 100-300 Å. In addition, the upper metal layer may further include a Ti layer having a thickness of 5-50 Å formed between the Ti silicide layer and the TiN layer.

According to a method of forming a metal layer in a semiconductor device according to an exemplary embodiment of the present invention, canting or falling of a metal line during a semiconductor manufacturing process may be prevented by improving adhesion of the upper metal layer and the insulation layer.

DETAILED DESCRIPTION OF THE EMBODIMENTS

An exemplary embodiment consistent with the present invention will hereinafter be described in detail with reference to the accompanying drawings.

FIG. 2A to FIG. 2D are cross-sectional views showing sequential stages of a method of forming a metal layer according to an exemplary embodiment consistent with the present invention.

Figure 1:
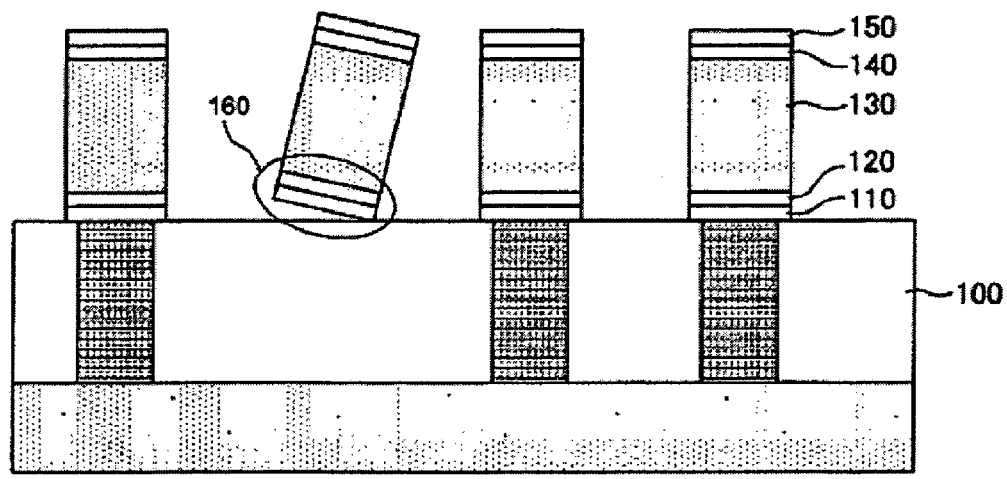
FIG. 1 shows a conventional method of forming a metal layer.
Figure 2A:
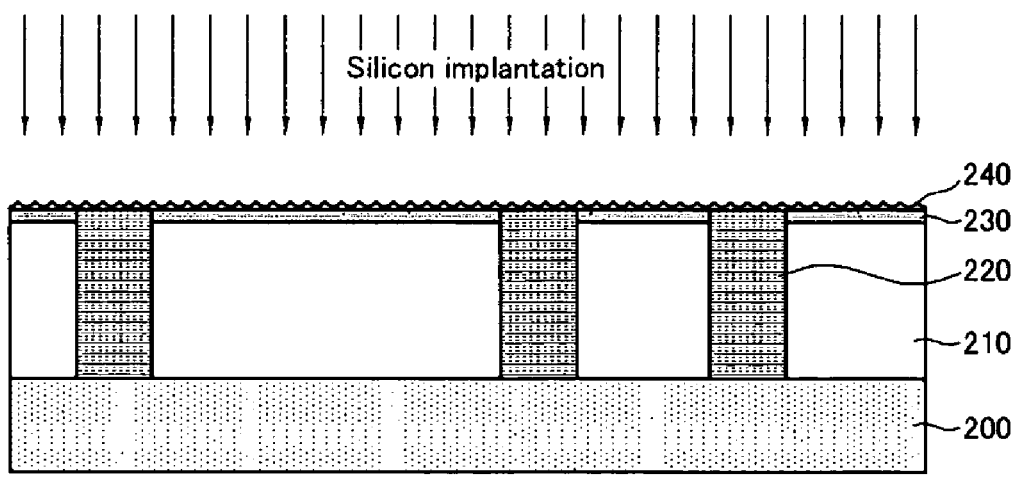
FIG. 2A to FIG. 2D are cross-sectional views showing sequential stages of a method of forming a metal layer according to an exemplary embodiment consistent with the present invention.

Firstly, as shown in FIG. 2A, a first insulation layer 210 and a second insulation layer 230 are formed on a substrate, the substrate having a lower metal layer 200 formed thereon. The second insulation layer 230 may be a silicon-rich (Si-rich) insulation layer. The Si-rich insulation layer may be formed to a thickness of 1000-3000 Å. Because the thickness of the insulation layer may be decreased by silicon loss in the insulation layer during subsequent silicidation process, the insulation layer may be formed more thickly than a typical insulation layer. After etching the first and second insulation layers 210 and 230, a metal material is filled therein so as to form a plug 220. The plug 220 may be formed as a tungsten plug.

After polishing the metal material, a silicon ion implantation process is performed on the substrate formed with the plug 220. By the silicon ion implantation process, a silicon layer 240 is formed on a surface of the second insulation layer 230. Implantation depth of the silicon ions by the silicon ion implantation process may be 50-300 Å.

In addition, when fluorinated silica glass (FSG) is used as the first insulation layer, the Si-rich oxide layer 230 may act as a fluorine diffusion barrier that prevents fluorine contained in the FSG from diffusing into other layers.

The first and second insulation layers 210 and 230 and the silicon layer 240 may also be formed in an alternate fashion.

For example, as shown in FIG. 2A, a first insulation layer 210 is formed on a substrate with a lower metal layer 200 formed thereon. After etching the first insulation layer 210, a metal material is filled therein so as to form a plug 220. Then, a silicon ion implantation process is performed on the substrate formed with the plug 220. By such silicon ion implantation, a Si-rich insulation layer 230 is formed at an uppermost portion of the first insulation layer 210, and a silicon layer 240 is formed on a top surface thereof.

Figure 2B:
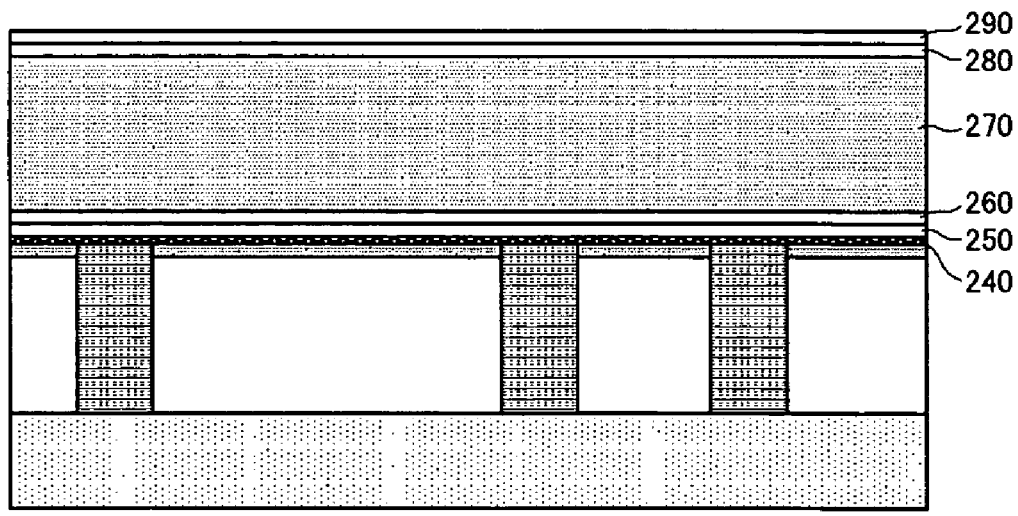

Subsequently, as shown in FIG. 2B, an upper metal layer is formed on the silicon layer 240 by sequentially depositing a lower Ti layer 250, a lower TiN layer 260, a conductive layer 270, an upper Ti layer 280, and an upper TiN layer 290. The lower Ti layer 250 may have a thickness of 30-100 Å, and the lower TiN layer 260 may have a thickness of 100-300 Å. The lower Ti layer 250 and lower TiN layer 260 may be used for suppressing interdiffusion between the conductive layer 270 and the silicon layer 240, and can be substituted by another metal layer such as a Ta/TaN layer.

Various metals such as gold (Au), aluminum (Al), copper (Cu), etc., may be used as the conductive layer 270. According to the present exemplary embodiment, aluminum is exemplarily used as the conductive layer 270.

Figure 2C:
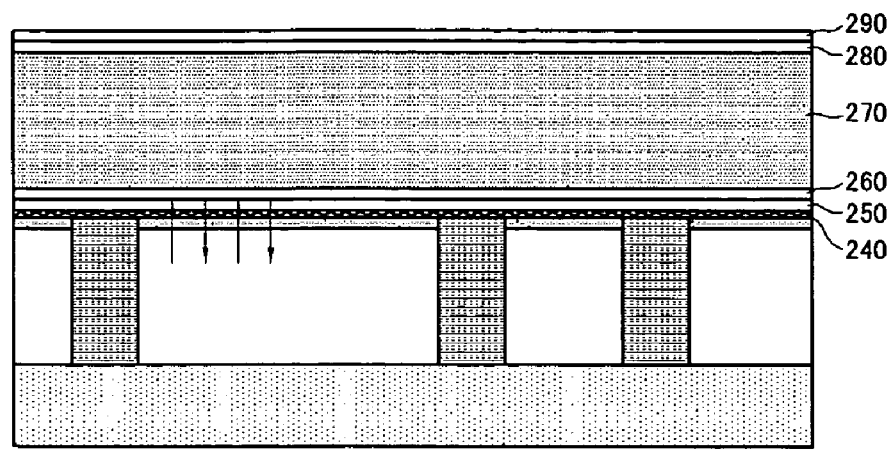
Figure 2D:
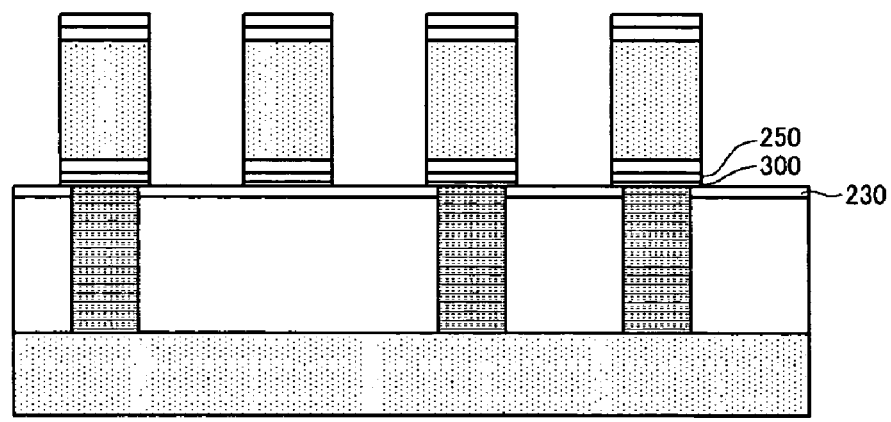

Subsequently, as shown in FIG. 2C, a predetermined region of the lower Ti layer 250 is silicided by heat treatment. As shown in FIG. 2D, when rapid thermal processing (RTP), rapid thermal annealing (RTA) using a furnace, or a general annealing process is performed, silicon in the second insulation layer 230 (or the silicon layer 240 on the second insulation layer 230) and titanium in the bottom layer of the upper metal layer mutually diffuse such that a titanium silicide (Ti-Silicide) 300 may be formed between the second insulation layer 230 and the upper metal layer. The rapid thermal process may be performed at a temperature of 100-500° C. for at least 10 seconds.

As shown in FIG. 2D, as a result of the interdiffusion, the thicknesses of the second insulation layer 230, the silicon layer 240, and the Ti layer 250 may be decreased, and all the silicon layer 240 may be silicided. The change of the thickness is roughly shown in FIG. 2C and FIG. 2D. The thickness of the second insulation layer 230 may be decreased by 50-300 Å due to loss of silicon atoms therein, and the Ti layer 250 may suffer a partial thickness loss of over 50% due to the interdiffusion reaction, so the final thickness of the Ti layer 250 may be 5-50 Å. The entire Ti layer 250 may be consumed according to a degree of the silicidation reaction. The Ti silicide layer 300 formed by the silicidation reaction may be 50-350 Å.

Such a titanium silicide 300 improves adhesion between the second insulation layer 230 and the upper metal layer. When only an insulation layer 230 without a metal layer, such as a plug, exists beneath the upper metal layer, the silicide layer can improve adhesive power between the second insulation layer 230 and the upper metal layer. The improved adhesion prevents a metal line subsequently formed by a photolithographic process and an etching process from canting or falling.

According to a method of forming a metal layer in a semiconductor device according to an exemplary embodiment consistent with the present invention, canting or falling of a metal line during a semiconductor manufacturing process may be prevented by improving adhesion of the upper metal layer and the insulation layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal layer in a semiconductor device, comprising:
   forming a lower metal layer on a substrate;
   forming an insulation layer on the lower metal layer;
   etching the insulation layer;
   forming a plug after etching the insulation layer;
   performing a silicon ion implantation process from above the insulation layer;
   forming an upper metal layer on the insulation layer, the upper metal layer having a bottom layer of a barrier metal; and
   siliciding a predetermined region of the bottom layer by heat treatment of the substrate.

2. The method of claim 1, wherein a Si-rich insulation layer is formed at an uppermost portion of the insulation layer by the silicon ion implantation process.

3. The method of claim 1, wherein a silicon layer is formed on the insulation layer by the silicon ion implantation process.

4. The method of claim 2, wherein a thickness of the Si-rich insulation layer is 1000-3000 Å, and an implantation depth of silicon ions by the silicon ion implantation process is 50-300 Å.

5. The method of claim 1, wherein during the siliciding, silicon at a top of the insulation layer and barrier metal in the bottom layer of the upper metal layer mutually diffuse so as to form a metal silicide.

6. The method of claim 1, wherein the siliciding is achieved by at least one of a rapid thermal process or a furnace annealing process.

7. The method of claim 6, wherein the rapid thermal process is performed at a temperature of 100-500° C. for at least 10 seconds.

8. The method of claim 5, wherein the barrier metal layer is formed as a Ti layer, a TiN layer, or a combination thereof.

9. The method of claim 8, wherein the barrier metal layer is formed by sequentially forming a Ti layer having a thickness of 30-100 Å and a TiN layer having a thickness of 100-300 Å.

10. The method of claim 1, wherein:
the silicon ion implantation process further forms an Si-rich insulation layer at an uppermost portion of the insulation layer or a silicon layer is formed on the insulation layer; and
the siliciding is performed such that silicon at a top of the insulation layer and titanium in the bottom layer of the upper metal layer mutually diffuses, so as to form a titanium silicide.

11. The method of claim 1, wherein, forming an upper metal layer comprises sequentially depositing a lower Ti layer, a lower TiN layer, a conductive layer, an upper Ti layer, and an upper TiN layer.

* * * * *